United States Patent [19]

Douglas

[11] 4,361,762
[45] Nov. 30, 1982

[54] APPARATUS AND METHOD FOR NEUTRALIZING THE BEAM IN AN ION IMPLANTER

[75] Inventor: Edward C. Douglas, Princeton Junction, N.J.

[73] Assignee: RCA Corporation, New York, N.Y.

[21] Appl. No.: 173,630

[22] Filed: Jul. 30, 1980

[51] Int. Cl.³ .......................................... H01J 37/317
[52] U.S. Cl. ............................ 250/251; 250/492.2; 378/160
[58] Field of Search ................. 250/492.2, 492.3, 514, 250/251, 306, 398, 492.1, 427, 423 R

[56] References Cited

U.S. PATENT DOCUMENTS

| | | | |
|---|---|---|---|
| 3,665,185 | 5/1972 | Goff | 250/309 |
| 3,778,626 | 12/1973 | Robertson | 250/492.1 |
| 3,908,183 | 9/1975 | Ennis, Jr. | |
| 4,120,700 | 10/1978 | Morimoto | |
| 4,135,097 | 1/1979 | Forneris | 250/306 |
| 4,278,890 | 7/1981 | Gruen et al. | 250/492.3 |

FOREIGN PATENT DOCUMENTS 1280013 7/1972 United Kingdom ............. 250/492.2

OTHER PUBLICATIONS

"High Production Semiconductor Processing at High Levels with High Reliability", brochure, Varian, Extrion Div., Gloucester, Mass., undated.

*Primary Examiner*—Alfred E. Smith
*Assistant Examiner*—Carolyn E. Fields
*Attorney, Agent, or Firm*—Birgit E. Morris; Donald S. Cohen; Joseph D. Lazar

[57] ABSTRACT

An ion implanter apparatus is described with provision for neutralizing the space charge potential of the ionic beam with a closed loop feedback system responding to the electrical charges that tend to accumulate on a target specimen. Neutralization is provided by a controllable electron source surrounding the beam. Flow of electrons to a plate radially outward of the electron source is used to derive a signal proportional to the beam ion current when the space charge potential of the beam is neutralized. The beam current signal can be used (1) to provide a read-out display for the operator; (2) to control the magnitude of the ion beam; (3) to be integrated to determine the total positive charge that enters the Faraday cage of the implanter for use to control the ion beam shutter; or (4) to effect relative movement of the specimen and the beam.

14 Claims, 4 Drawing Figures

APPARATUS AND METHOD FOR NEUTRALIZING THE BEAM IN AN ION IMPLANTER

BACKGROUND OF THE INVENTION

The present invention relates to an improved ion implantation apparatus. More particularly, the invention concerns an ion implantation apparatus in which the net space charge of the ion beam is neutralized before impingement on the target specimen.

A typical ion implantation apparatus provides a beam of ions for impingement on a target specimen such as a wafer or chip used in the semiconductor industry. The beam of ions provides particles which impinge on the specimen and penetrate its surface to provide an implant of the particle in the specimen. One of the problems that prevails in such apparatus used to ion implant charged particles on insulated substrates such as silicon-on-sapphire (SOS) or oxide coated silicon is that on impact the ions transfer positive charges which accumulate on the insulating surface as well as on islands of metal on the insulating surface of the substrate. The positive charges can accumulate to such a magnitude as to not only seriously affect deleteriously the surface quality of the specimen material but can moreover cause a fracture of the structure of the specimen. In addition, the accumulated positive charge can also deleteriously affect the orderly impingement of further positively charged particles.

Heretofore the problem of the accumulated positive surface charge has been mitigated by neutralizing the wafer surface with electrons or by neutralizing all or parts of the ions of the ionic beam with electrons before the beam impinges the wafer surface. Several apparatus of the prior art have been designed to accomplish one or more of these purposes. For example, U.S. Pat. No. 3,980,183 to R. M. Ennis, Jr. on Sept. 23, 1975 describes an ion implantation system in which electrons are "flooded" on a target to neutralize the charge of impinging ions. In another system described in U.S. Pat. No. 4,120,700 to K. Morimoto on Oct. 17, 1978 an ion implantation apparatus has a thermionic emission source which provides electrons to an ion beam to cause clusters of neutral particles in the ion beam for impingement together with ionic particle clusters on the target.

SUMMARY OF THE INVENTION

According to the present invention, the ionic beam of an ion implant apparatus is neutralized by injecting into the beam electrons under control of a closed-loop feedback circuit that responds to charge potential that collects on the substrate of the target to reduce the charge potential on the substrate towards zero. Means are provided according to a feature of the invention for generating a signal proportional to the ion beam current determined by the electron flow to neutralize the net space charge of the beam.

DETAILED DESCRIPTION OF THE PREFERRED EMBODIMENT

Figure 1:
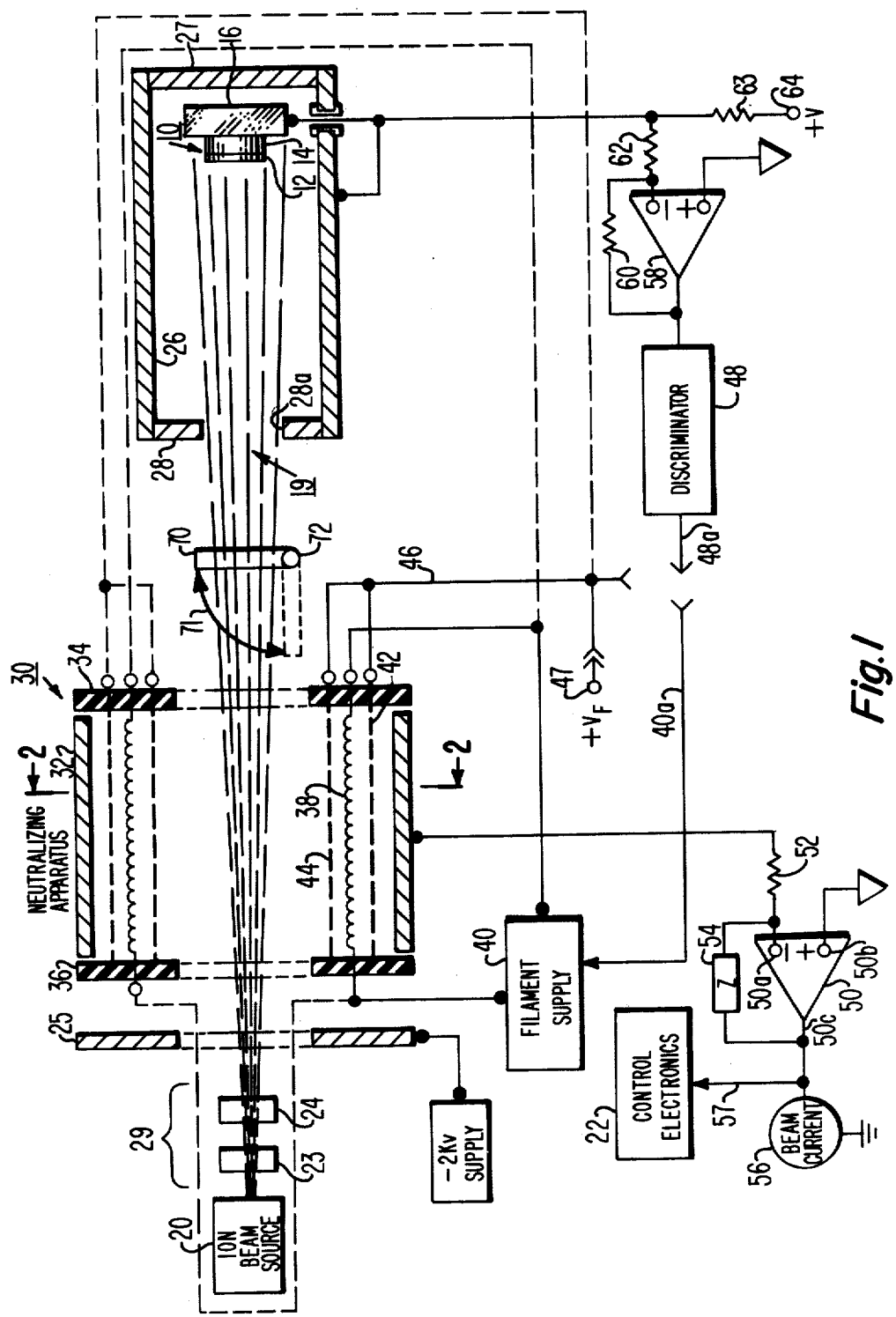
FIG. 1 is a schematic of an ion implanter apparatus embodying the present invention.
Figure 4:
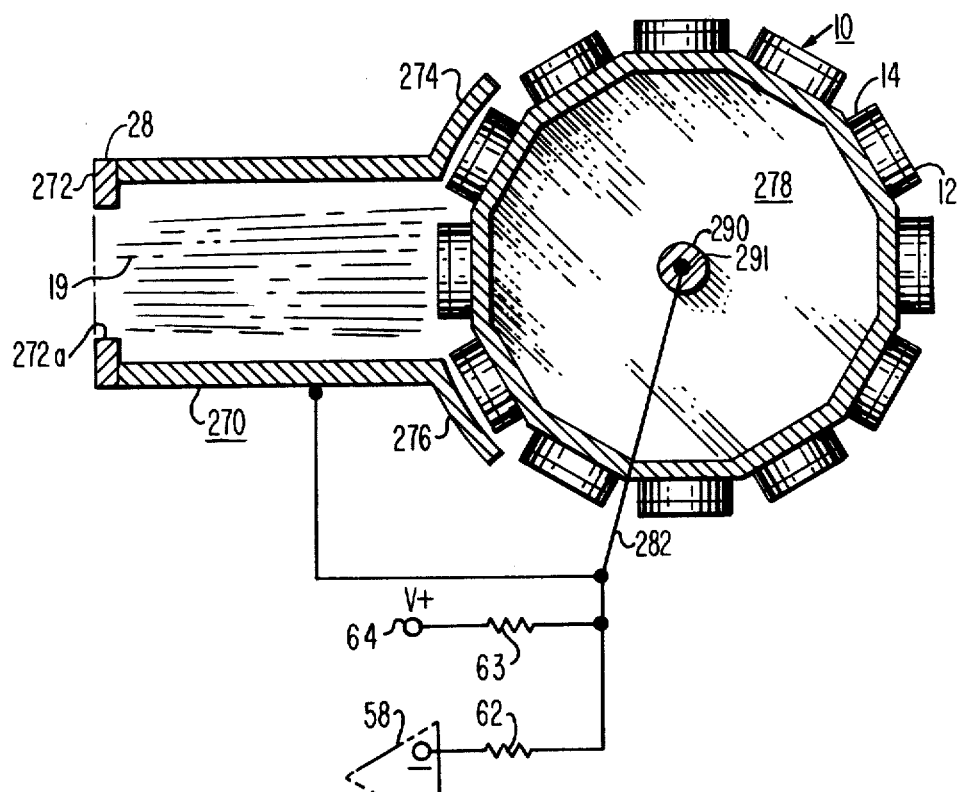
FIG. 4 is a schematic of a portion of the apparatus shown in FIG. 1 illustrating another modification of the apparatus.

A target such as a typical semiconductor device 10 to be treated by the ion implantation apparatus of the invention as shown in FIG. 1 has a semiconductor layer 12 of silicon material and an insulator body or substrate 14 of sapphire material. The layer 12 is to receive ions by implantation to, for example, change a portion or the entire surface from one conductivity type to another. The target device 10 is carried on a conductive support 16. Target 10 may also be a device formed of a conductive material on an insulating substrate. Support 16 is suitably arranged to be movable so as to reposition, in turn, a plurality of similar devices 10 into the implantation station as by a carrousel or the like. One form of a carrousel is shown in FIG. 4 to be described.

The ion beam 19 is provided by an ion beam source 20 under control of control electronics 22. Control electronics 22 of any suitable form includes means to control the current of the beam 19 according to manually selected values or to control signals; means to control the voltage on the various control electrodes and magnetic deflection apparatus; means to position or move the wafer support 16; means to move a shutter 70 to interrupt the beam 19; and other control functions usually provided in an ion implantation apparatus. After passing the beam 19 through a beam formation segment 29 comprising a mass analyzing magnet 23 and an accelerating tube 24, an annular suppressor plate 25 is provided with a suitable negative potential (−2 kilovolts) to isolate the beam 19 from electrons in the beam formation segment 29 of the system. A shutter 70 pivoted on the shaft 72 as by arrow 71 from the position as shown blocks the beam 19 to the dotted line position to pass the beam. Movement of the shutter is under control of the control electronics 22. A Faraday cup apparatus 26 of a generally cylindrical form contains the wafer device 10 and is used to collect the ions and electrons which impinge on the device surface or are secondarily emitted from the device surface. End wall 27 is preferably closed while end wall 28 has a beam size defining aperture 28a to define the size of the beam 19 to be passed onto the device 10. If support 16 is part of a carrousel (illustrated in FIG. 4 to be described) to provide for, in sequence, a plurality of devices 10 for treatment, the structure of the Faraday cup detector apparatus is suitably modified.

The ion implanter thus far described is a typical ion implanter with the beam and Faraday cup operated in a vacuum chamber such as an Extrion 200-1000 implanter manufactured and distributed by the Varian-Extrion Corporation of Gloucester, Mass.

In operation an ion beam 19 is projected towards a target, for example, comprising the semiconductor device 10, causing an implantation of charged particles of the beam 19 into the surface of the material 12 to thereby form a controlled layer of impurity atoms of known position and concentration to be used, for example, to selectively change the conductivity type of a semiconductor material 12.

The beam 19 having a space charge potential due to the ionized particles is suitably electrostatically scanned in raster fashion for relatively low beam currents in the order of 20 to 500 microamps to scan the beam 19 over the target 10. For an ionic beam required for the typical high current uses with currents exceeding 500 microamperes, the ionic beam 19 cannot be swept in raster fashion. It is for this reason for such uses that the apparatus embodying the invention provides a fixed beam 19 with the device 10 being scanned as by being moved in front of the beam 19 by conventional movable means carrying the device support 16. Such conventional mechanical movement systems have slow sweep rates with the result that the charge potential in the high current beam 19 can build up the voltage in isolated patterns on the insulated target wafers 10, such as patterns on silicon-on-sapphire samples, to very high values. For example, for an isolated pattern of conducting material, such as on layer 12, whose size is smaller than the cross sectional area of the beam 19, supported on a sapphire wafer 14 of thickness $t_{saap}$, the voltage value generated by a beam of current intensity $J_B$ is represented by the following expression:

$$V = J_B d_1 t_{saap}/v \cdot \epsilon_o K_{saap} \tag{1}$$

where $d_1$ is the beam diameter, $v$ is the relative beam scan velocity, $\epsilon_o$ is the permittivity of free space and $K_{saap}$ is the relative dielectric constant of the sapphire substrate. For the embodiment being described, $J_B = 0.25 \times 10^{-3}$ amps/cm$^2$, $v = 67.5$ cm/sec, and using $d_1 = 2$ cm and $t_{saap} = 25$ mils, the voltage reached at a given device position in one beam pass is $5 \times 10^5$ volts. This value of voltage is so great as to cause an electrical voltage discharge arc through the 25 mil thickness of the device 10 to destroy it. This destructive effect has been seen observed in an Extrion 200-1000 ion implanter. Accordingly, this destructive effect has severely limited the use of such an ion implanter for the production of SOS devices.

The problem is based on the positive space charge of the beam which in turn causes positive charges to accumulate on the surface of the device 10 which charges cannot leak to the substrate holder 16 due to the insulating sapphire substrate 14. The accumulated positive charge hence develops a voltage discharge arc when the breakdown voltage of the insulating substrate is reached. In order to overcome the accumulated charge problem, one solution can be provided by means to neutralize the space charge of the ionic beam 19 so that high voltages due to the charge storage on the wafer device 10 are eliminated. Another solution involves the provision of a source of electrons bathing or flooding the surface 12 to neutralize any charges that can collect on the surface of the device. This other solution is not entirely satisfactory since an accurate measurement of the incident beam current is needed for control purposes. The electron flooding technique is usually accomplished by mounting the electron flood filaments inside the Faraday apparatus 26. This arrangement is cumbersome and presents isolation problems since the electron flood system requires milliamps or amperes of current and the detection system must be sensitive to current at values in the microamps or nanoamps range.

Figure 2:
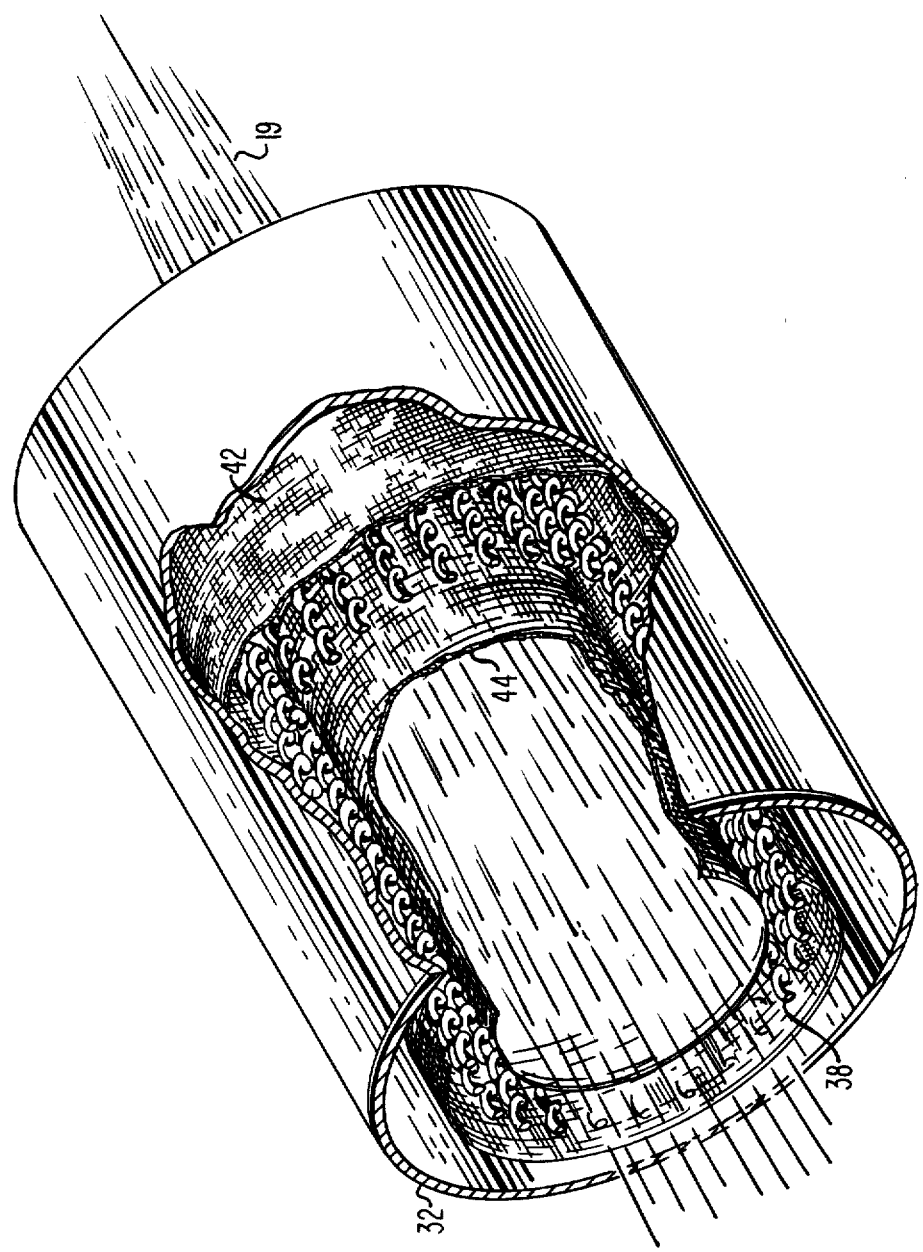
FIG. 2 is a perspective view partly in section of the apparatus as seen along viewing line 2—2 of FIG. 1.

According to the present invention, the space charge of the ionic beam is neutralized before the beam 19 impacts the target device 10 by neutralizing apparatus 30 by means of a closed-loop feedback circuit. The neutralizing apparatus 30 in addition to neutralizing the beam 19 also provides a signal proportional to the ionic beam current before the beam is neutralized. This beam current signal is used to drive the wafer control electronics 22 of the ion implanter via control path 57. The neutralizing apparatus 30 is formed of a conductive cylindrical housing 32 serving as an outer conductive plate as seen in perspective in FIG. 2. Apparatus 30 is located substantially upstream of the beam remote from the target and the Faraday cup apparatus 26. Insulating annular end members 34 and 36 serve to support a plurality of filaments 38, preferably of the thermionic electron emission type, extending between each member 34 and 36 and connected to a filament supply 40 including means to heat the filaments. An outer control grid member 42 in the form of a cylindrical or planar screen and a similar inner control grid member 44 are arranged, respectively, outside and inside of the filaments 38 as seen also in perspective in FIG. 2. The respective inner 42 and outer 44 grid members are connected via conducting path 46 to a fixed voltage source $V_f$ at terminal 47 or to the output of a discriminator 48 to be described further hereinafter. Alternatively, the discriminator 48 can be used to vary the filament emission while the outer grid members are biased with a constant positive voltage.

The outer plate 32 is connected to an operational amplifier 50 arranged as an integrator or amplifier via an input resistor 52 and a feedback impedance 54. To serve as an integrator, the operational amplifier 50 is suitably provided with a capacitor for impedance 54 across the negative input terminal 50a and output terminal 50c, the positive input terminal 50b being connected to ground. The total integrated detected charge provided by amplifier 50 combined with the known wafer scan area A of aperture 28a is used to determine the implanted dose according to the relation $$D = Q \text{ atoms/cm}^2/qA \tag{2}$$

where D is the dose, Q in coulombs is the integrated charge in the beam and $q = 1.6 \times 10^{-19}$ coulombs is the charge on a single ion in the beam. The output of the integrating amplifier 50 is connected to the control electronics 22 via path 57 to control the dose of desired atoms implanted into the wafer surface by moving the shutter 70 to pass or stop the beam 19 according to a predetermined value of dose or charge.

The output of the amplifier 50 can be suitably processed to yield a signal proportional to the beam current of the ionic beam 19. The magnitude of the beam current is displayed by means of a suitable meter 56. The meter 56 thus provides a read-out of the beam current which information is used by the operator for calibration and adjustment purposes. The beam current signal is also used by electronics 22 to effect movement of the target 10 across the beam 19 in a manner known in the art. Moreover, the beam current output signal from amplifier 50, although not usually done in practice, may be used by electronics 22 to control the intensity of the beam from source 20 if desired.

The conductive support 16 is coupled to the input of discriminator 48 via an operational amplifier 58 having a feedback resistor 60. The negative input terminal of op amp 58 is connected via resistor 62 to conductor support 16. Furthermore, the support plate 16 is provided with a positive potential V at terminal 64 via current limiting resistor 63.

In operation, the filaments 38 under control of the control grids 44 and 42 emit electrons which flow in approximately equal numbers both to the outer plate 32 and to the ion beam 19. The space charge potential of ionic beam 19 varies in practice between one volt positive when it is fully ionized with no neutralization and zero volts when it is fully neutralized. The grids 44 and 42 are adjusted with a voltage potential from discriminator 48 with output lead 48a connected to lead 46 of such magnitude that the electron flow to the beam 19 just neutralizes the beam to a potential of zero volts. The electrons and thus the current flow to the outer plate 32 is passed to the integrator 50 which develops a signal proportional to the total charge. This beam current signal is applied to the control electronics 22 to drive the implanter control system to move the wafer target 10 across the beam 19.

Various alternative modifications may be made of the circuit just described for controlling the flow of electrons from the emitter filaments 38 to the beam 19 and to the outer conductive plate 32. In one such alternative arrangement, the control grids 44 and 42 may be coupled via path 46 to a fixed voltage $+V_F$ at terminal 47. With such a fixed voltage on the control grids the discriminator 48 provides an output directly to the filament supply 40 via output lead 48a coupled to lead 40a. With such an arrangement, as the discriminator (48) output voltage varies as a function of the current from the support 16, the filament (38) current will be modified to reduce the current incident on the wafer to zero.

A still further modification of the electron supply arrangement maintains the filament supply voltage at a fixed potential and varies both the inner control grid 44 and the outer control grid 42 by the discriminator 48 output voltage via path 48a and path 46. Accordingly, the electron supply to the beam 19 to neutralize it can be done by modulation of the cylindrical control grids 42 and 44 together.

While it is not entirely clear as to what occurs as the electrons from filaments 38 are projected into the ionic beam 19, it appears that the space charge potential of the beam as a whole is neutralized. It is not clear, for example, whether each individual ionized atom in the beam is individually neutralized. It is more likely that the electrons emanating from the filaments 38 form a plasma with the beam 19, the combination of which is space charge neutral. Nevertheless, to insure that the electrons from the filament 38 will flow to the specimen device 10 target along with the positive ions in the beam 19 and thereby accomplish the zero net charge deposition, the device 10 is effectively biased positively as by the positive voltage source at terminal 64.

Accordingly, there is a flow of both positive ions and negative charges (electrons) to the target device 10. The current generated in the target by the action of the implanted particles, which are ionic and positively charged, is fed to the discriminator 48 via the inverting amplifier 58. Discriminator 48, responding to the current from the device 10, will provide a control voltage to the respective inner and outer control grids 44 and 42 to increase the grid voltage if the current is positive whereby the grid voltage is increased to thereby provide more electrons from the filaments 38 to the beam 19. If the signal current from the device 10 is negative, the grid voltages are decreased to reduce the number of electrons passing to the beam 19. In the alternative, discriminator 48 can provide modulating control signals to the filaments 38 via supply 40 as explained above.

Figure 3:
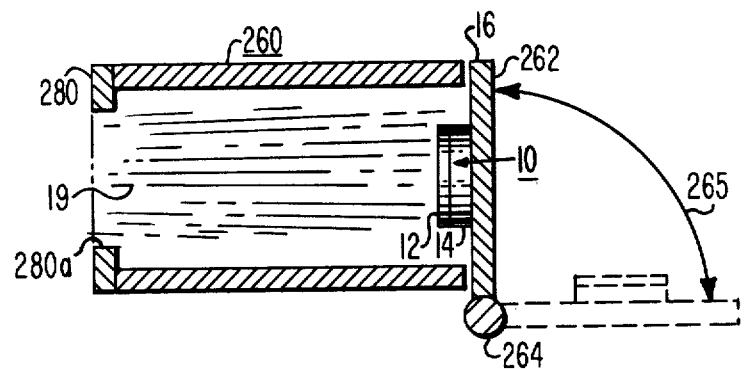
FIG. 3 is a schematic of a portion of the apparatus shown in FIG. 1 of one modification of the apparatus.

A suitable modification of the Faraday cup apparatus 26 arranged to provide target devices into the apparatus is illustrated in FIG. 3. A Faraday cup detector apparatus represented by reference numeral 260 is generally a cylinder having an end plate 280 having an aperture 280a. The opposite end of the apparatus 26 is open having a pivotal end wall 262 pivoting about shaft 264. The end wall 262 serves to carry the substrate support 16 for each device 10. The end wall 262 is pivoted as shown by arrow 265 to the dotted line position at which the devices 10 are replaced in turn for treatment.

A suitable arrangement for providing a plurality of devices 10 for treatment by the implanter is a carrousel illustrated in FIG. 4. In this modification a Faraday cup apparatus 270 is formed of a cylinder having an end wall 272 with an aperture 272a. The opposite open end is provided with a pair of curved members 274 and 276 spaced close to a carrousel wheel 278 rotating about a translateable and rotatable metal shaft 290. Carrousel is a closed-end cylinder formed of conductive material such as metal to conduct current from the Faraday apparatus 270 and the target devices 10 to amplifier 58 via path 282 connected to a slip ring 291 on shaft 290. Carrousel 278 is preferably oriented to rotate in a horizontal position with shaft 290 in a vertical position to simplify the support of the targets 10. Twelve devices 10 are replaceably mounted on the peripheral structure of the carrousel 278. The carrousel 278 in rotation moves each device 10 in sequence within the Faraday cup detector apparatus 270 for exposure to the ion beam 19 for ion implantation. Furthermore, the rotational movement of the carrousel 278 effects a scanning of the device 10 across the fixed beam 19. Shaft 290 is also arranged to be moved in and out of the plane of the paper to effect translational movement of the device 10 relative to beam 19. Thus, X and Y (orthogonal) mechanical scanning of the device 10 is provided.

There is thus provided a closed loop feedback system which locks onto a zero current on the target device 10. The feedback system thus maintains an effective zero charge of a beam impinging on the target device 10. When the feedback system is locked onto a zero current signal from the device 10, the current from the outer plate 32 will be proportional to the beam current before neutralization. The proportionality constant which relates the current of the outer plate to the beam current is determined primarily by the geometry of the grid structure 30 and can be determined to any degree of accuracy by experiment. This proportionality factor can be compensated for electronically by the proper selection of the input resistor 52 coupled to amplifier 50.

As described hereinabove, the ion implanter of the invention provides a closed loop feedback system for controlling an ionic beam for implantation of desired particles into a target device without an accumulation of a charge on the device. Furthermore, the invention provides means for determining the value of the ionic beam necessary to effect the desired implantation and to provide a signal representing the charge of the ion beam. This ion beam charge signal results from the integration of the beam current signal and is used to control the time the beam remains on the target by the operation of a shutter. Prior to integration the beam current signal can be used as a display, for the operator's use, as a control signal to effect scanning of the beam across the wafer or to move the wafer relative to a stationary beam. Moreover, if desired, the beam current signal can be used to control the intensity of the beam current.

What is claimd is:

1. In a particle implantation apparatus of the type for providing a beam of particles for impingement upon a target comprising material of conductive or semiconductive properties on an insulating substrate, the apparatus having a source of ionic particles for providing a beam of ionic particles to the target whereby the target substrate accumulates a charge potential from ions impinging on the material, and means for providing relative movement between the target and the beam at a predetermined rate, wherein the improvement comprises:

a closed loop feedback circuit including controllable means positioned adjacent the beam and being responsive to a first signal for supplying electrons to the beam of ions to neutralize the net charge of the beam; and further including means responsive to the charge potential on the substrate to develop said first signal to control the flow of electrons from the electron supply means to the beam to neutralize the net charge of the beam and thereby reduce the charge potential on the substrate towards zero;

wherein said electron supply means further includes means to supply electrons to a plate disposed radially outwardly of the supply means, and means responsive to the flow of electrons to said plate for generating a second signal proportional to the ion beam current.

2. In an apparatus according to claim 1, wherein the electron supply means is a thermionic emission filament extending adjacent the beam at a location substantially upstream of the beam remote from the target.

3. In an apparatus according to claim 2, further including a plurality of the filaments arranged in a generally cylindrical pattern around the beam.

4. In an apparatus according to claim 1, wherein the controllable means includes a control grid positioned between the supply means and the beam.

5. In an apparatus according to claim 4, wherein the control grid surrounds the beam.

6. In an apparatus according to claim 1, further including means responsive to said second signal to control the beam of ionic particles to provide thereby an ionic beam of a predetermined magnitude.

7. In an apparatus according to claim 6, wherein said second signal controls a shutter to interrupt the ion beam when the second signal has a predetermined value.

8. In an apparatus according to claim 1, wherein the closed loop feedback circuit includes a discriminator for sensing the relative magnitude of the target potential compared to zero potential to generate the first signal to reduce the target potential towards zero potential.

9. In a particle implantation apparatus of the type for providing a beam of particles for impingement upon a target, the apparatus having a source of ionic particles for providing a beam of ionic particles to the target comprising a material of conductive or semiconductor properties on an insulating substrate whereby the target accumulates a charge potential from ions impinging on the material, and means for providing relative movement between the target and the beam at a predetermined rate, wherein the improvement comprises:

means to supply a controllable amount of electrons to the beam to reduce the net space charge of the beam towards zero and to supply electrons simultaneously to a plate disposed radially outwardly of the electron supply means; and means responsive to the electron flow from the electron supply means to said plate to generate a control signal proportional to the ion beam current.

10. In an apparatus according to claim 9, further including means responsive to the control signal for providing a visual display of the beam current.

11. In an apparatus according to claim 9, further including means responsive to the control signal for integrating the control signal to provide a signal indicative of the charge accumulating on the target.

12. In an apparatus according to claim 9, further including means responsive to the control signal for moving the target across the beam.

13. In a method of neutralizing the ionic beam of an ionic implantation apparatus of the type for providing a beam of particles for impingement upon a target, the apparatus having a source of ionic particles for providing a beam of ionic particles to the target, said target comprising a material of conductive or semiconductor properties on an insulating substrate, whereby the target accumulates a charge potential from ions impinging on the material, and means for providing movement between the target and the beam at a predetermined rate, comprising the steps of:

sensing the charge potential on the target;

generating in response to the target potential a control signal;

providing a supply of electrons as a function of the control signal to neutralize the beam of ions with electrons of sufficient quantity to reduce the net charge of the beam substantially to zero potential and simultaneously providing a supply of electrons to a plate disposed radially outwardly of the ion beam; and generating in response to the flow of electrons to said plate a signal proportional to the ion beam current.

14. In a method according to claim 13, further including the step of generating a second control signal as a function of the neutralization electrons to control the flow of the ion beam to the target by interrupting the beam when the quantity of neutralized electrons exceeds a predetermined value.

* * * * *